United States Patent
Hou et al.

(10) Patent No.: US 12,417,986 B2
(45) Date of Patent: Sep. 16, 2025

(54) INTEGRATED CIRCUIT UNIT AND WAFER WITH INTEGRATED CIRCUIT UNITS

(71) Applicant: Chengdu Monolithic Power Systems Co., Ltd., Chengdu (CN)

(72) Inventors: Liwei Hou, Chengdu (CN); Suwei Wang, Chengdu (CN); Heng Li, Chengdu (CN); Ze-Qiang Yao, Santa Clara, CA (US); Junjian Zhao, San Jose, CA (US)

(73) Assignee: Chengdu Monolithic Power Systems Co., Ltd., Sichuan (CN)

( * ) Notice: Subject to any disclaimer, the term of this patent is extended or adjusted under 35 U.S.C. 154(b) by 617 days.

(21) Appl. No.: 17/707,213

(22) Filed: Mar. 29, 2022

(65) Prior Publication Data
US 2022/0320013 A1    Oct. 6, 2022

(30) Foreign Application Priority Data
Mar. 31, 2021   (CN) .......................... 202110347171.1

(51) Int. Cl.
*H01L 23/00* (2006.01)
*H01L 23/528* (2006.01)

(52) U.S. Cl.
CPC .......... *H01L 23/562* (2013.01); *H01L 23/528* (2013.01)

(58) Field of Classification Search
CPC ... H01L 23/528; H01L 23/562; H01L 23/585; H05K 1/184; H05K 1/186; H05K 1/187; H05K 1/189
See application file for complete search history.

(56) References Cited

U.S. PATENT DOCUMENTS

| | | | |
|---|---|---|---|
| 2003/0098179 A1* | 5/2003 | Obata | H05K 3/4614 174/262 |
| 2020/0168554 A1* | 5/2020 | Fay | H01L 23/5389 |

FOREIGN PATENT DOCUMENTS

CN    102655125 A    9/2012

* cited by examiner

*Primary Examiner* — Brook Kebede
(74) *Attorney, Agent, or Firm* — Perkins Coie LLP

(57) ABSTRACT

Integrated circuit ("IC") unit and a wafer for fabricating IC units. The wafer has a first surface and a second surface opposite to the first surface. A redistribution metal layer may be formed on the first surface and may be patterned to have a redistribution metal layer pattern. A backside metal layer may be formed on the second surface and patterned to have a backside metal layer pattern so that the backside metal layer may be adapted to generate a backside stress on the wafer to at least partially offset a front side stress generated by the redistribution metal layer on the wafer.

31 Claims, 9 Drawing Sheets

INTEGRATED CIRCUIT UNIT AND WAFER WITH INTEGRATED CIRCUIT UNITS

CROSS-REFERENCE TO RELATED APPLICATION(S)

This application claims the benefit of CN application No. 202110347171.1 filed on Mar. 31, 2021 and incorporated herein by reference.

TECHNICAL FIELD

This disclosure relates generally to integrated circuits, and particularly but not exclusively relates to integrated circuit unit and wafer having integrated circuit units formed thereon.

BACKGROUND

In the process of fabricating semiconductor integrated circuits on a wafer, it is often necessary to fabricate redistribution metal layers and metal contacts on the front side of the wafer to allow electrical connection and signal exchange between the integrated circuits and external circuits. However, after the thermal reflow process, due to factors such as the stress of the redistribution metal layer and the metal contact, the wafer may be warped or deformed and bent, which will affect the yield of the final product.

SUMMARY

In accordance with an embodiment of the present disclosure, a wafer is disclosed. The wafer may comprise: a first surface, having a redistribution metal layer formed on the first surface; and a second surface, opposite to the first surface and having a backside metal layer formed on the second surface. The redistribution metal layer may be patterned to have a redistribution metal layer pattern. The backside metal layer may be patterned to have a backside metal layer pattern and may be adapted to generate a backside stress on the wafer to at least partially offset a front side stress generated by the redistribution metal layer on the wafer.

In accordance with an exemplary embodiment of the present disclosure, the redistribution metal layer may be patterned into a plurality of redistribution metal trace segments having a layout pattern forming the redistribution metal layer pattern.

In accordance with an exemplary embodiment of the present disclosure, the backside metal layer may be patterned into a corresponding plurality of backside metal trace segments corresponding to the plurality of redistribution metal trace segments. Routing traces of the plurality of backside metal trace segments form the backside metal layer pattern.

In accordance with an exemplary embodiment of the present disclosure, the backside metal layer pattern may be identical to the redistribution metal layer pattern.

In accordance with an exemplary embodiment of the present disclosure, the backside metal layer pattern and the redistribution metal layer pattern may be mirror images of each other with reference to a middle plane between the first surface and the second surface of the wafer.

In accordance with an exemplary embodiment of the present disclosure, among the plurality of backside metal trace segments, each one of those having a dimension that is greater than or equal to a first predetermined dimension is either further divided into metal blocks with each metal block of a dimension smaller than or equal to a second predetermined dimension or has one or more holes formed therein. The second predetermined dimension is smaller than the first predetermined dimension.

In accordance with an exemplary embodiment of the present disclosure, each one of the plurality of backside metal trace segments is further divided into metal blocks with each metal block of a dimension smaller than or equal to the second predetermined dimension.

In accordance with an embodiment of the present disclosure, an integrated circuit ("IC") unit is disclosed. The IC unit comprises a die, having a front surface and a back surface opposite to the front surface, wherein a rewiring metal layer is formed on the front surface and is patterned to have a predetermined first wiring pattern, and wherein a back metal layer is formed on the back surface and is patterned to have a predetermined second wiring pattern and is adapted to generate a backside stress on the die to at least partially offset a front side stress generated by the rewiring metal layer on the die.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features. Likewise, the relative sizes of elements illustrated by the drawings may differ from the relative size depicted.

The use of the same reference label in different drawings indicates the same or like components or structures with substantially the same functions for the sake of simplicity.

DETAILED DESCRIPTION

Various embodiments of the present invention will now be described. In the following description, some specific details, such as example device structures, example manufacturing process and manufacturing steps, and example values for the process, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," right," "in," "out," "front," "back," "up," "down, "top," "atop", "bottom," "over," "under," "overlying," "underlying," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner to establish an electrical relationship between the elements that are coupled. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1A:
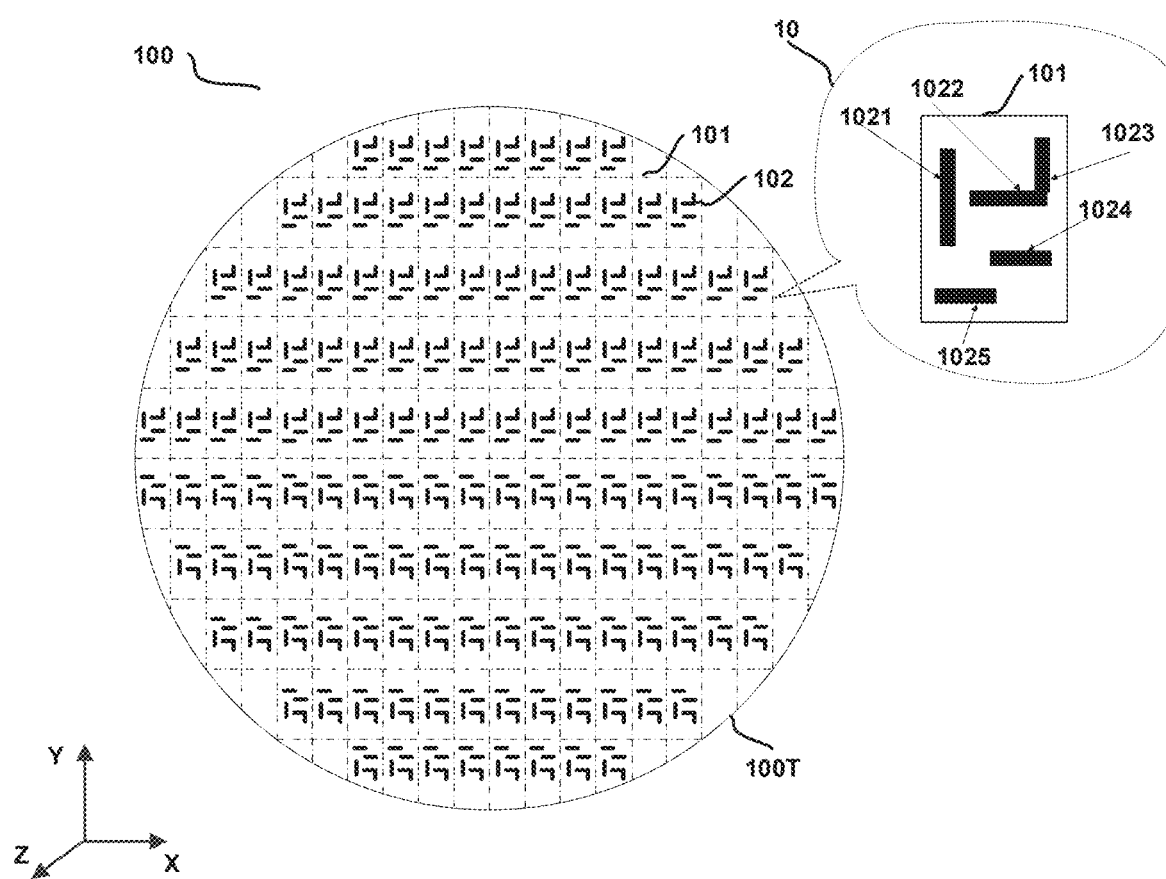
FIG. 1A illustrates an illustrative top plane view of a first surface 100T of a wafer 100 with integrated circuits fabricated thereon in accordance with an embodiment of the present invention.

FIG. 1A illustrates a top plane view of a front side of a wafer 100 with integrated circuits fabricated thereon in accordance with an embodiment of the present invention. The top plan view in FIG. 1A may be considered as a planar view of a first surface (e.g. a front surface) 100T of the wafer 100 projected on/inspected from/taken from the X-Y plane defined by the X and Y axis in a coordinate defined by X, Y and Z axis perpendicular to each other. Currently, wafers used to fabricate integrated circuits mainly consist of circular semiconductor materials having a diameter of 8 inches or 12 inches. However, the present disclosure is not intended to define and limit the size and material of the wafer 100. In the exemplary embodiment of FIG. 1A, the wafer 100 may comprise a plurality of integrated circuit ("IC") units 101 formed in/on the wafer 100. The boundaries of the IC units 101 are illustrated in dashed lines. One of ordinary skill in the art would understand that the wafer 100 may be cut along the dashed line boundaries in the Z axis direction into individual singulated IC units 101, and each independent IC unit 101 may be used to implement/realize specific function that is required by to an application system where it would be applied to. Each IC unit 101 directly obtained by dicing the wafer 100 may also be referred to as an IC die or an IC bare die. Those skilled in the art should further understand that most of the detailed structures of each IC unit 101 are not shown in the top plan view of FIG. 1A. The present invention is not intended to limit or define structure, function and size of each IC unit 101. A redistribution metal layer may be formed on the first surface 100T of the wafer 100, and the redistribution metal layer may be patterned to have a redistribution metal layer pattern, thereby for each IC unit 101, forming a rewiring metal layer 102 of each IC unit 101. That is to say, after patterning, the redistribution metal layer on the first surface 100T may be patterned into a plurality of redistribution metal trace segments forming a layout pattern referred to as the redistribution metal layer pattern. In the example of FIG. 1A, each one of the plurality of redistribution metal trace segments is illustrated/represented by a straight solid line segment. The rewiring metal layer 102 of each IC unit 101 may comprise a portion (e.g. multiple segments) of the plurality of redistribution metal trace segments to allow electrical coupling between components within each IC unit 101 and/or to allow each IC unit 101 for electrical connection and/or signal exchange with outside circuitries. The rewiring metal layer 102 of each IC unit 101 may thus have a predetermined first wiring pattern (i.e., layout pattern formed by the portion (i.e. the multiple segments) of the plurality of redistribution metal trace segments included in the rewiring metal layer 102 of each IC unit 101). Therefore, it would be understood that on the first surface (front surface) of each IC unit 101 obtained by dicing the wafer 100 such a rewiring metal layer 102 having the predetermined first wiring pattern is formed. For helping to better understand the various embodiments of the present invention, in the example of FIG. 1A, an enlarged illustrative top plan view (projected on/inspected from the X-Y plane) of the first surface of a single IC unit 101 is shown in the dashed frame 10. In this example, the rewiring metal layer 102 of each integrated circuit unit 101 is illustrated as to include five segments of metal traces 1021, 1022, 1023, 1024 and 1025 of the plurality of redistribution metal trace segments formed after the redistribution metal layer on the first surface 100T of the wafer 100 has been patterned, the layout pattern of the five segments of metal traces 1021~1025 forms (or appears as) the predetermined first wiring pattern. Those skilled in the art should understand that the predetermined first wiring pattern of the rewiring metal layer 102 on the first surface 100T shown in FIG. 1A is only illustrative, and is not used to represent an actual and specific wiring pattern, nor is it used to limit or define the predetermined first wiring pattern. The predetermined first wiring pattern may be patterned according to actual circuit application requirements of each integrated circuit unit 101. The redistribution metal layer pattern on the first surface 100T of the wafer 100 is constituted by a collection of the predetermined first wiring patterns of the rewiring metal layers 102 of all the integrated circuit units 101 fabricated on/in the wafer 100.

Figure 1B:
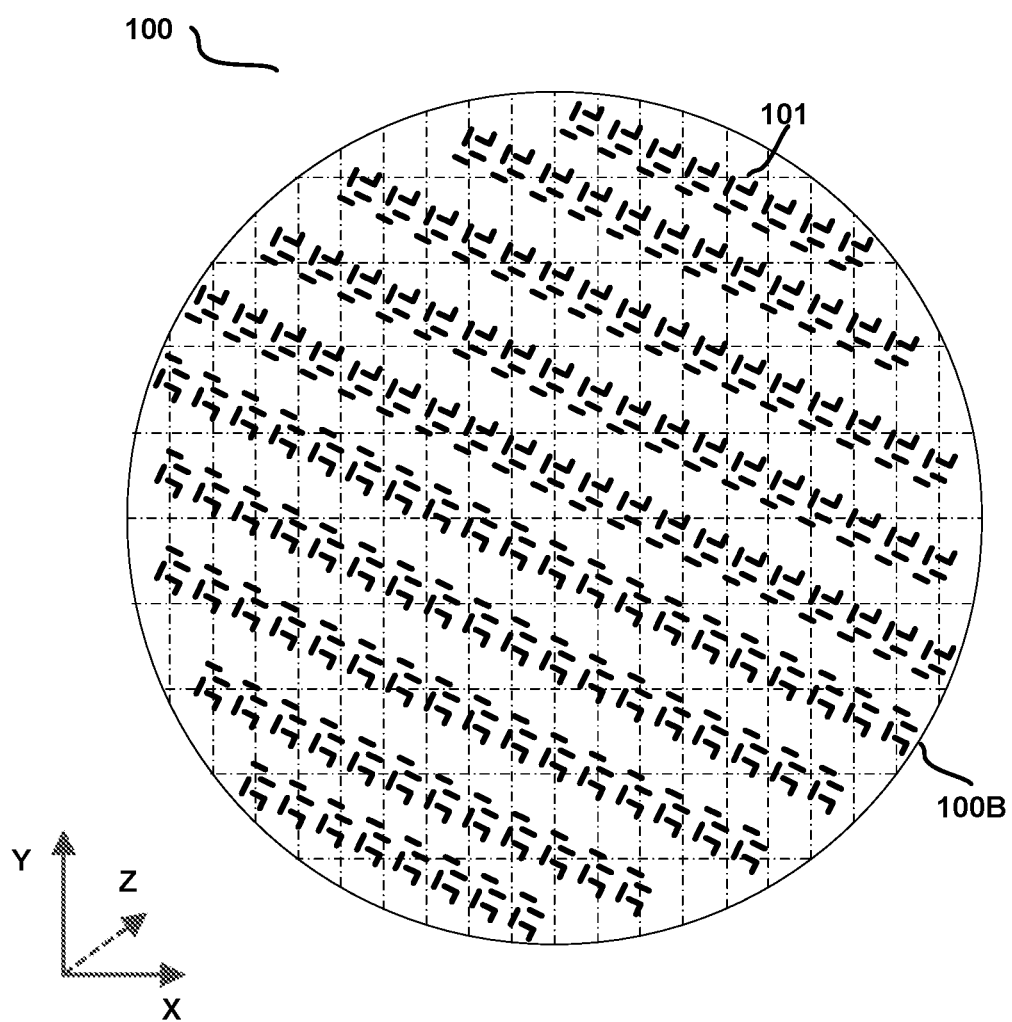
FIG. 1B illustrates an illustrative top plan view of a second surface 100B of the wafer 100 in accordance with an embodiment of the present invention.

A backside metal layer may be formed on a second surface 100B (e.g. a back surface) of the wafer 100. The second surface 100B is opposite to the first surface 100T. As shown in FIG. 1B, it may be considered that a planar view of the second surface (e.g. the back surface) 100B of the wafer 100 projected on/inspected from/taken from the X-Y plane defined by the X and Y axis in the coordinate defined by X, Y and Z axis perpendicular to each other is illustrated out. The backside metal layer may be patterned to have a backside metal layer pattern. That is to say, after patterning, the backside metal layer on the second surface 100B may be patterned into a plurality of backside metal trace segments forming a layout pattern referred to as the backside metal layer pattern. The backside metal layer with the backside metal layer pattern may be adapted to generate a backside stress on the wafer 100 (i.e. the backside metal layer may apply the backside stress to the second surface 100B of the wafer 100) to at least partially offset a front side stress generated by the redistribution metal layer on the wafer 100 (i.e. the front side stress is applied to the first surface 100T of the wafer 100 by the redistribution metal layer). In this fashion, stress on the wafer 100 caused by the redistribution metal layer may be at least reduced. In the example of FIG.

1B, each one of the plurality of backside metal trace segments is illustrated/represented by a straight solid line segment. Forming the backside metal layer on the second surface 100B of the wafer 100 may advantageously help to correct or reduce warpage of the wafer 100 that may be caused by forming the redistribution metal layer on the first surface 100T, thereby improving product yield. For instance, in an example, warpage of a wafer without the backside metal layer may exceed the range of ±350 μm, while warpage of the wafer 100 with the backside metal layer may be within the range of ±300 μm, which may even be optimized to be within the range of ±150 μm.

In accordance with an embodiment of the present invention, still referring to the illustration in FIG. 1B, the backside metal layer pattern may be identical to the redistribution metal layer pattern. However, those skilled in the art should understand that this does not mean that for each integrated circuit unit 101 obtained by cutting/dicing the wafer 100, wiring pattern of a back metal layer on a second surface of the integrated circuit unit 101 should also be identical to the predetermined first wiring pattern of the rewiring metal layer 102 on the first surface of the integrated circuit unit 101. That is to say, the wiring pattern of the back metal layer on the second surface of each integrated circuit unit 101 may be different from the predetermined first wiring pattern of the rewiring metal layer 102 on the first surface of the integrated circuit unit 101.

Figure 1C:
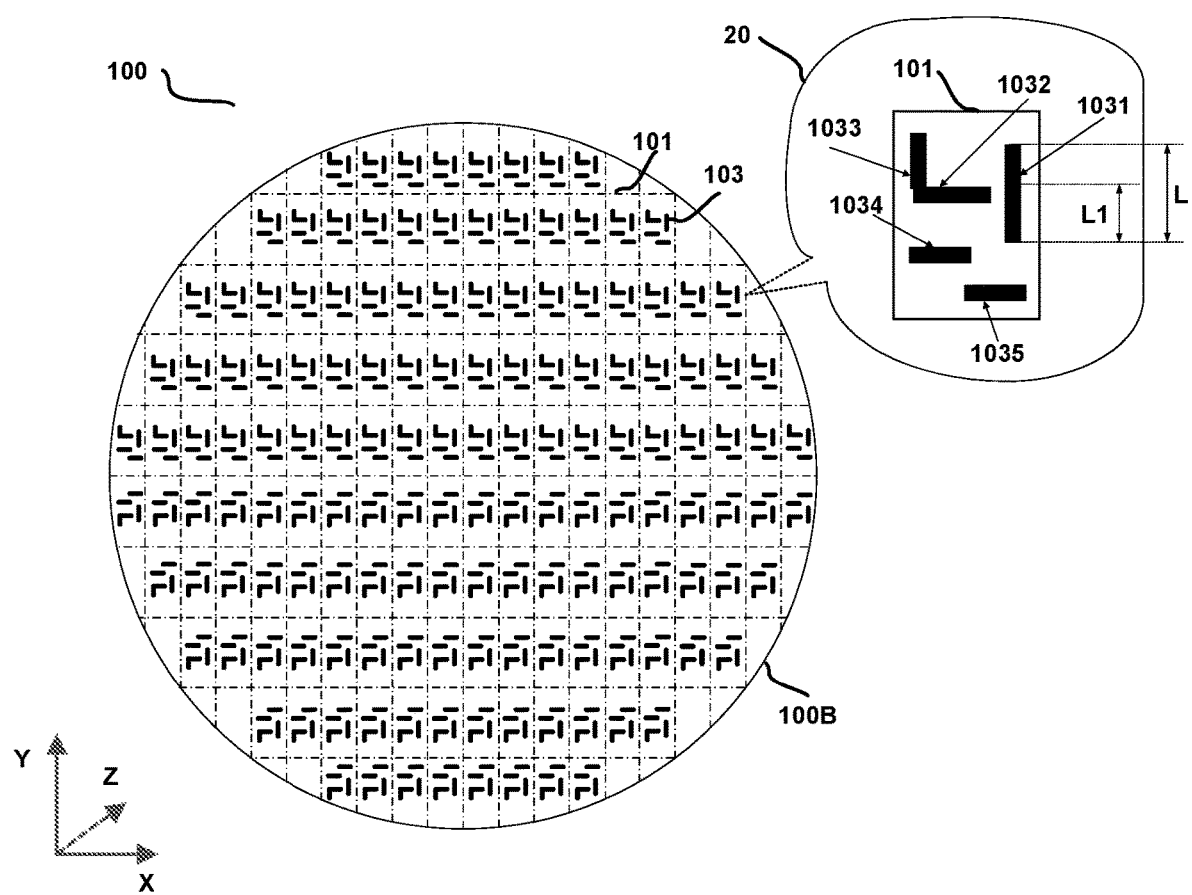
FIG. 1C illustrates an illustrative top plan view of a second surface 100B of the wafer 100 in accordance with an alternative embodiment of the present invention.

In accordance with an alternative embodiment of the present invention, by patterning the backside metal layer on the second surface 100B of the wafer 100, a back metal layer 103 of each integrated circuit unit 101 may be formed for each integrated circuit unit 101. Referring to the illustration in FIG. 1C, the boundaries between different IC units 101 are still indicated by dashed lines, and the back metal layer 103 of each IC unit 101 may have a predetermined second wiring pattern. The back metal layer 103 of each IC unit 101 may comprise a portion (e.g. multiple segments) of the plurality of backside metal trace segments. The predetermined second wiring pattern may refer to a layout pattern formed by the portion (i.e. the multiple segments) of the plurality of redistribution metal trace segments included in the back metal layer 103 of each IC unit 101. For helping to better understand the various embodiments of the present invention, in the example of FIG. 1C, an enlarged illustrative top plan view (projected on/inspected from the X-Y plane) of the second surface of a single IC unit 101 is shown in the dashed frame 20. In this example, the back metal layer 103 of each integrated circuit unit 101 is illustrated as to include five segments of metal traces 1031, 1032, 1033, 1034 and 1035 of the plurality of backside metal trace segments formed after the backside metal layer on the second surface 100B of the wafer 100 has been patterned, the layout pattern of the five segments of metal traces 1031~1035 forms (or appears as) the predetermined second wiring pattern. Those skilled in the art should understand that the predetermined second wiring pattern of the back metal layer 103 on the second surface of each IC unit 101 shown in FIG. 1C is only illustrative, and is not used to represent an actual and specific wiring pattern, nor is it used to limit or define the predetermined second wiring pattern. The backside metal layer pattern on the second surface 100B of the wafer 100 is composed of a collection of the predetermined second wiring patterns of the back metal layers 103 of all the integrated circuit units 101 fabricated on/in the wafer 100. In other words, the backside metal layer pattern on the second surface 100S of the wafer 100 may also be referred to as an aggregate pattern of the predetermined second wiring patterns of the back metal layers 103 of all the integrated circuit units 101 presented on the second surface 100B of the wafer 100. Therefore, in such an exemplary embodiment, when mentioning "the backside metal layer pattern may be identical to the redistribution metal layer pattern", it may refer to that the aggregate pattern of the predetermined second wiring patterns of the back metal layers 103 of all the integrated circuit units 101 may be identical to the redistribution metal layer pattern. In one embodiment, for each IC unit 101 obtained by dicing the wafer 100, the predetermined second wiring pattern of the back metal layer 103 on the second surface of the IC unit 101 and the predetermined first wiring pattern of the rewiring metal layer 102 on the first surface of the IC unit 101 may also be identical. For example, the predetermined second wiring pattern formed by the layout patterns of the five-segment back metal traces 1031 to 1035 on the second surface of the IC unit 101 shown in the dashed frame 20 is illustrated to be identical to the predetermined first wiring pattern formed by the layout patterns of the five-segment rewiring metal traces 1021 to 1025 on the first surface of the IC unit 101 shown in the dashed frame 10.

Figure 1D:
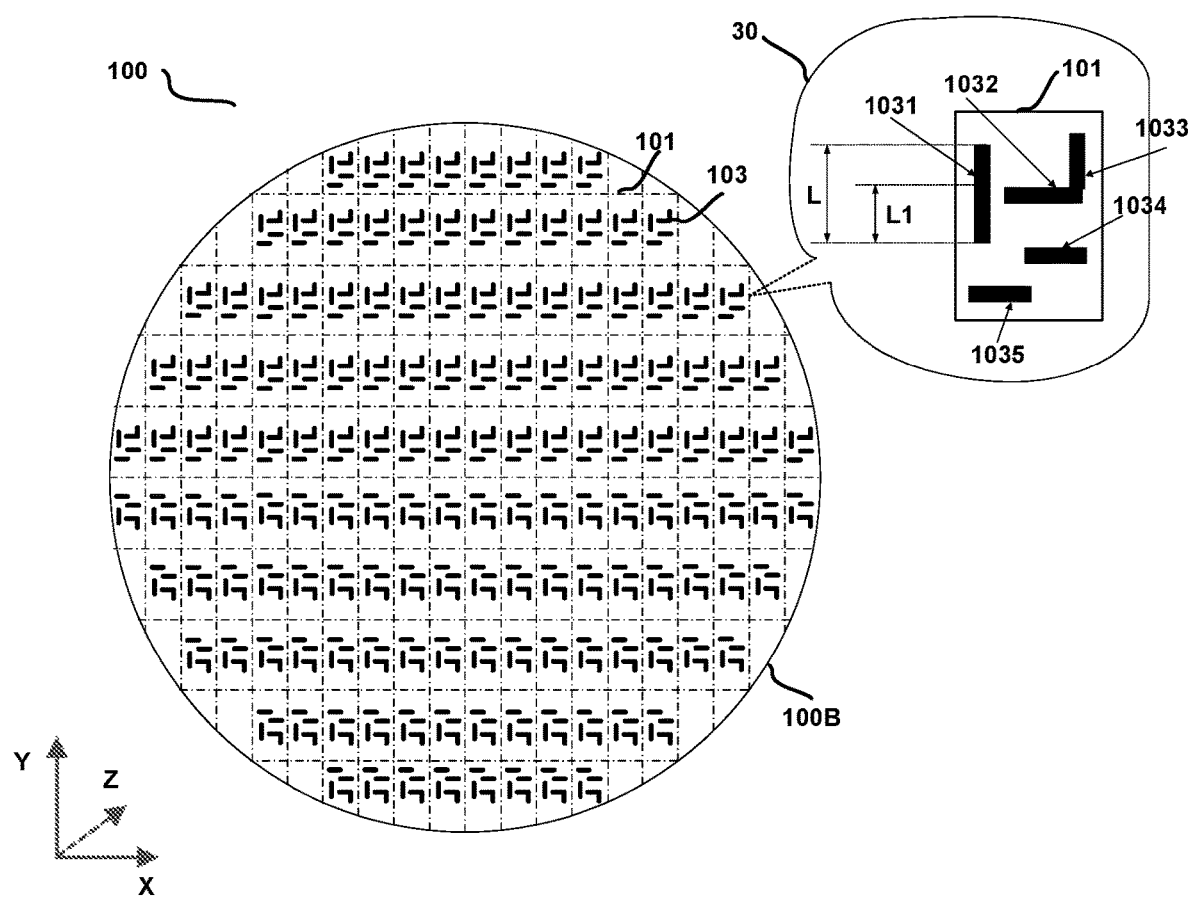
FIG. 1D illustrates an illustrative top plan view of a second surface 100B of the wafer 100 in accordance with another alternative embodiment of the present invention.

In accordance with an alternative embodiment of the present invention, at every point or position on the second surface 100B of the wafer 100 that is corresponding to a corresponding point or position on the first surface 100T of the wafer 100 (each one point or position on the second surface 100B and its corresponding one point or position on the first surface 100T refer to the points/positions on the first surface 100T and the second surface 100S having the same coordinates on the X-Y plane), the back metal layer pattern and the redistribution metal layer pattern are identical. Referring to the illustration in FIG. 1D, it may also be understood that the projection of the backside metal layer pattern on the second surface 100B on the X-Y plane is the same as and overlap with the projection of the redistribution metal layer pattern on the first surface 100T on the X-Y plane. Or it may also be understood that in this exemplary embodiment, the backside metal layer pattern and the redistribution metal layer pattern are mirror images of each other with reference to a middle plane between the first surface 100T and the second surface 100S of the wafer 100 (hereinafter referred to as "the embodiment in which the backside metal layer pattern and the redistribution metal layer pattern are mirror images of each other"), a vertical distance from the middle plane to the first surface 100T is equal to a vertical distance from the middle plane to the second surface 100S. Correspondingly, it also means that for each integrated circuit unit 101 obtained by cutting the wafer 100, at every point or position on its second surface corresponding to a corresponding point or position on its first surface (each one point or position on the second surface of the IC unit 101 and its corresponding one point or position on the first surface of the IC unit 101 refer to the points/positions on the first surface and the second surface having the same coordinates on the X-Y plane), the predetermined second wiring pattern of the back metal layer 103 on its second surface is identical to the predetermined first wiring pattern of the rewiring metal layer 102 on its first surface. Or it may also be understood as that the projection of the predetermined second wiring pattern on the X-Y plane is the same and overlapping with the projection of the predetermined first wiring pattern on the X-Y plane. It may also be understood as that the predetermined second wiring pattern and the predetermined first wiring pattern are "mirror images of each other" with reference to a middle plane between the first surface and the second surface of the IC unit 101. In the example of FIG. 1D, an enlarged illustrative top plan view (projected on/inspected from the X-Y plane) of the second surface of a single IC unit 101 on the X-Y plane is shown in the dashed frame 30. In this example, the back metal layer 103 of each integrated circuit unit 101 is still illustrated as being patterned to include five segments of metal traces 1031, 1032, 1033, 1034 and 1035, the layout pattern of the five segments of metal traces 1031~1035 appears as the predetermined second wiring pattern. In this example, the predetermined second wiring pattern constituted by the layout patterns of the five backside metal trace segments 1031 to 1035 on the second surface of the integrated circuit unit 101 shown in the dashed frame 30 and the predetermined first wiring pattern formed by the layout patterns of the five rewiring metal trace-segments 1021 to 1025 on the first surface of the integrated circuit unit 101 shown in the dashed frame 10 are "mirror images" of each other. In this way, the effect of the backside metal layer fabricated on the second surface 100S of the wafer 100 on reducing the stress generated by the redistribution metal layer fabricated on the first surface 100T on the wafer 100 may ideally be achieved by 100% at highest. That is, ideally, the backside stress of the backside metal layer on the wafer 100 and the front side stress of the redistribution metal layer on the wafer 100 may completely offset by each other, so the effect of reducing the warpage of the wafer 100 can theoretically be as high as 100%.

Those skilled in the art should understand that the terms "identical" or "mirror images" mentioned in various embodiments of the present disclosure refer to "identical" or "mirror images" in an ideal or a theoretical sense, and It is not used to be limited to completely error-free "identical" or "mirror images" in actual products but should include deviations or error tolerances due to the production process or caused by the limitation of the manufacturing processes for the actual products.

Figure 1E:
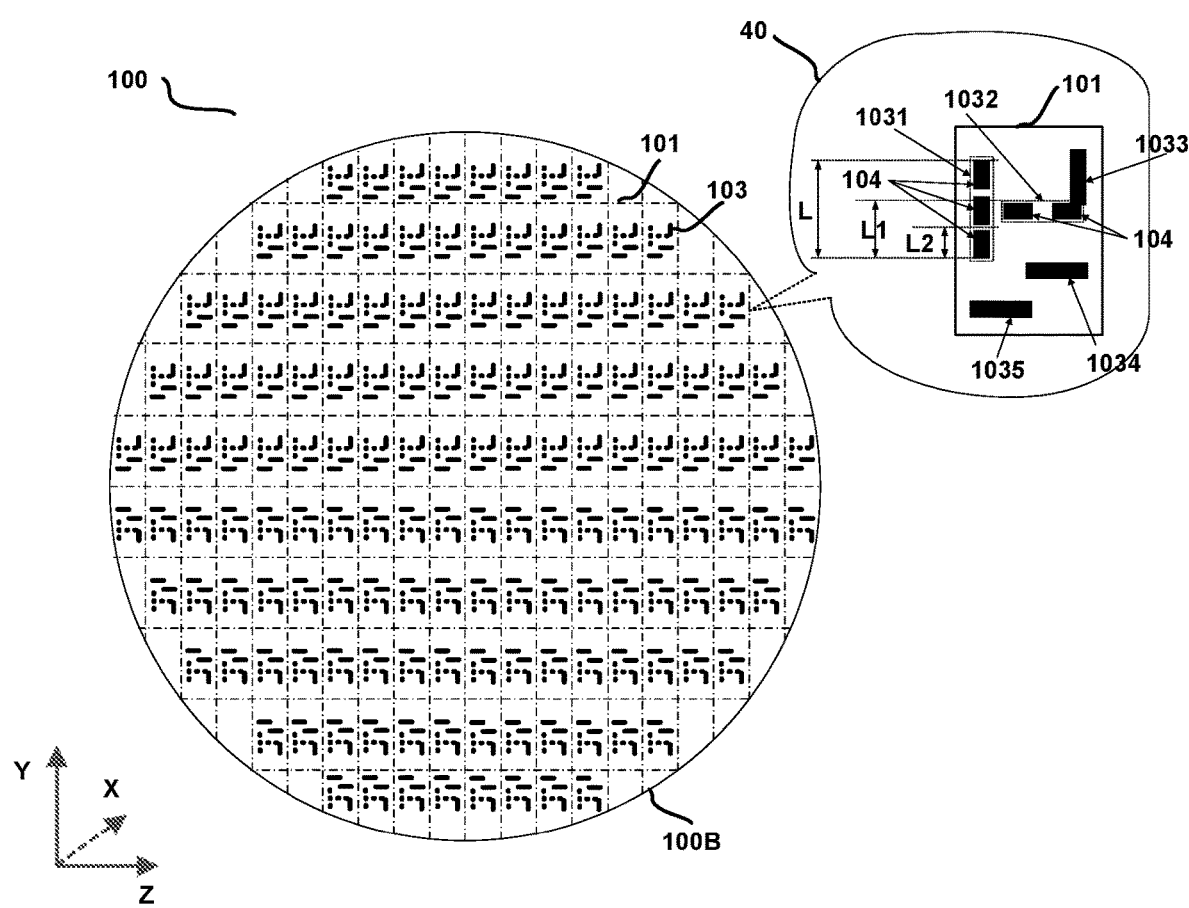
FIG. 1E illustrates an illustrative top plan view of a second surface 100B of the wafer 100 in accordance with yet another alternative embodiment of the present invention.

FIG. 1E illustrates an illustrative top plan view of the second surface (which may be referred to as the back surface) 100B of the wafer 100 projected on/inspected from/taken from the X-Y plane according to a variant embodiment of the present disclosure. At the same time, it can also be understood as that an illustrative top plan view of the second surface (back surface) of the integrated circuit units 101 in this variant embodiment projected on/inspected from/taken from the X-Y plane is shown out, and the boundaries between the integrated circuit units 101 are still indicated by dashed lines. Referring to FIG. 1E, according to an embodiment of the present disclosure, compared with the embodiments described above with reference to FIG. 1B-FIG. 1D, the difference is that among the plurality of backside metal trace segments on the second surface 100B of the wafer 100, those having a dimension L that is greater than or equal to a first predetermined dimension L1 (for example, L1=400 μm in one example, and in another example L1=500 μm) may be referred to as large dimension metal trace segments, and each one of the large dimension metal trace segments may be further divided into metal blocks 104 with each metal block 104 having a dimension smaller than or equal to a second predetermined dimension L2 (L2<L1). For a single backside metal trace segment or a single metal block 104, dimension here refers to the relatively larger dimension of its length and width. There may be a predetermined distance between every two adjacent metal blocks 104. For instance, in one example, each one of the large dimension metal trace segments in the plurality of backside metal trace segments on the second surface 100B of the wafer 100 is further divided into metal blocks with a dimension of 200 μm*200 μm or smaller than 200 μm*200 μm (that is, this example, L2=200 μm). In another example, each one of the large dimension metal trace segments is further divided into metal blocks with a dimension smaller than or equal to 150 μm*150 μm (i.e.: in this example, L2=150 μm). In this fashion, it may advantageously help to improve the adhesion of the backside metal layer on the second surface 100B of the wafer 100 and reduce the probability of peeling between the backside metal layer and the second surface 100B of the wafer 100. For the sake of simplicity, the example shown in FIG. 1E is only illustrated as a modification based on the "embodiment in which the backside metal layer pattern and the redistribution metal layer pattern are mirror images of each other" shown in FIG. 1D as an example, each one of the backside metal trace segments having a dimension L greater than or equal to the first predetermined dimension L1 on the back surface 100B is divided into metal blocks 104 with each metal block 104 of a dimension smaller than or equal to the second predetermined dimension L2. In this variant example shown in FIG. 1E, it also means that for each integrated circuit unit 101 obtained by cutting the wafer 100, each one of the backside metal trace segments having a dimension L greater than or equal to the first predetermined dimension L1 in the back metal layer 103 of each integrated circuit unit 101 is divided into metal blocks 104 with each metal block 104 of a dimension smaller than or equal to the second predetermined dimension L2. For example, FIG. 1E illustrates an enlarged illustrative top plan view (projected on/inspected from the X-Y plane) of the second surface (e.g. back surface) of a single integrated circuit unit 101 according to this variant embodiment in dashed frame 40. Compared with the example of FIG. 1D (enlarged top plan view illustrated in dashed frame 30), the difference is that the two backside metal trace segments labelled with 1031 and 1032 among the five backside metal trace segments 1031 to 1035 on the second surface of each integrated circuit unit 101 are shown as having a dimension L greater than or equal to the first predetermined dimension L1, so each of the two backside metal trace segments 1031 and 1032 is illustrated as being divided into metal blocks 104 with each metal block 104 having a dimension smaller than or equal to the second predetermined dimension L2. The routing traces of the five backside metal trace segments 1031 to 1035 constitute/present as the predetermined second wiring pattern of the back metal layer 103 of each IC unit 101 in this example. The routing traces of the plurality of backside metal trace segments on the entire second surface 100S of the wafer 100 constitute/present as the backside metal layer pattern of the wafer 100. Those skilled in the art should understand that for a single backside metal trace segment, the "routing trace" may be understood as its wiring routing track. For example, in the example of FIG. 1E, the single backside metal trace segment 1031 with a dimension L larger than or equal to the first predetermined dimension L1 is divided into a plurality of metal blocks 104 (shown as three in FIG. 1E) with each metal block 104 of a dimension smaller than or equal to the second predetermined dimension L2, thus the wiring routing track formed by the plurality of metal blocks 104 is the routing trace of the single backside metal trace segment 1031. Those skilled in the art should understand that although FIG. 1E shows the illustrative top plan view of a variant embodiment obtained by modifying the example of FIG. 1D, the above modifications and descriptions mentioned with reference to FIG. 1E may also be applicable to variant embodiments obtained by modifying the examples of FIGS. 1B to 1D.

Figure 1F:
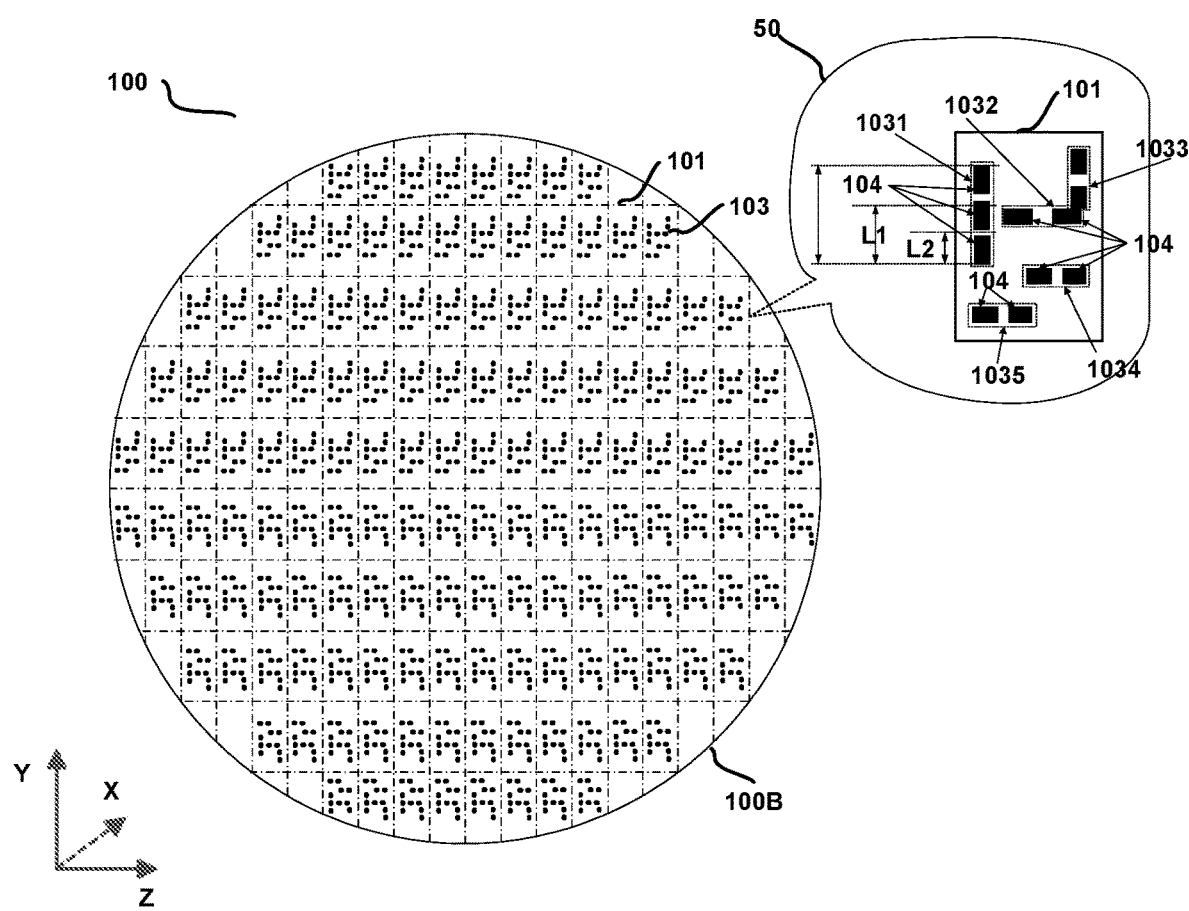
FIG. 1F illustrates an illustrative top plan view of a second surface 100B of the wafer 100 in accordance with yet another alternative embodiment of the present invention.

FIG. 1F shows an illustrative top plan view of the second surface (which may be referred to as the back surface) 100B of the wafer 100 projected on/inspected from/taken from the X-Y plane according to another variant embodiment of the present disclosure. At the same time, it can also be understood as that an illustrative top plan view of the second surface (back surface) of the integrated circuit units 101 on the X-Y plane in this further modified embodiment is shown out, and the boundaries between the integrated circuit units 101 are still indicated by dashed lines. Referring to FIG. 1F, according to an embodiment of the present disclosure, compared with the embodiments described above with reference to FIGS. 1B to 1D, the difference is that each one of the plurality of backside metal trace segments on the second surface 100B of the wafer 100 is divided into metal blocks 104 with each metal block 104 having a dimension smaller than or equal to the second predetermined dimension L2. There may be a predetermined distance between every two adjacent metal blocks 104. For instance, in one example, each one of the plurality of backside metal trace segments on the second surface 100B of the wafer 100 is divided into metal blocks with a dimension of 200 μm*200 μm or smaller than 200 μm*200 μm (that is, this example, L2=200 μm). In another example, each one of the plurality of backside metal trace segments on the second surface 100B of the wafer 100 is divided into metal blocks with a dimension smaller than or equal to 150 μm*150 μm (i.e.: in this example, L2=150 μm). In this fashion, it may advantageously help to further improve the adhesion of the backside metal layer on the second surface 100B of the wafer 100 and reduce the probability of peeling between the backside metal layer and the second surface 100B of the wafer 100. For the sake of simplicity, the example shown in FIG. 1F is only illustrated as a modification based on the "embodiment in which the backside metal layer pattern and the redistribution metal layer pattern are mirror images of each other" shown in FIG. 1D as an example, each one of the plurality of backside metal trace segments on the back surface 100B is divided into metal blocks 104 with each metal block 104 of a dimension smaller than or equal to the second predetermined dimension L2. In this variant example shown in FIG. 1F, it also means that for each integrated circuit unit 101 obtained by cutting the wafer 100, each one of the multiple backside metal trace segments in the back metal layer 103 of each integrated circuit unit 101 is divided into metal blocks 104 with each metal block 104 of a dimension smaller than or equal to the second predetermined dimension L2. For example, FIG. 1F illustrates an enlarged illustrative top plan view (projected on/inspected from the X-Y plane) of the second surface of a single integrated circuit unit 101 according to this variant embodiment in dashed frame 50. Compared with the example of FIG. 1D (enlarged top plan view illustrated in dashed frame 30), the difference lies in that each one of the five backside metal trace segments 1031 to 1035 on the second surface of each integrated circuit unit 101 is illustrated as being divided into metal blocks 104 with each metal block 104 having a dimension smaller than or equal to the second predetermined dimension L2. The routing traces of the five backside metal trace segments 1031 to 1035 constitute/present as the predetermined second wiring pattern of the back metal layer 103 of each IC unit 101 in this example. The routing traces of the plurality of backside metal trace segments on the entire second surface 1008 of the wafer 100 constitute/present as the backside metal layer pattern of the wafer 100. Those skilled in the art should understand that for a single backside metal trace segment, the "routing trace" may be understood as the its wiring routing track. For example, in the example of FIG. 1F, the single backside metal trace segment 1031 is divided into a plurality of metal blocks 104 (shown as three in FIG. 1F) with each metal block 104 of a dimension smaller than or equal to the second predetermined dimension L2, and thus the wiring routing track formed by the plurality of metal blocks 104 is the routing trace of the backside metal trace segment 1031. Those skilled in the art should understand that although FIG. 1F shows the illustrative top plan view of a variant embodiment obtained by modifying the example of FIG. 1D, the above description modifications and descriptions mentioned with reference to FIG. 1F may also be applicable to variant embodiments obtained by modifying of the examples of FIG. 1B to FIG. 1D.

Figure 1G:
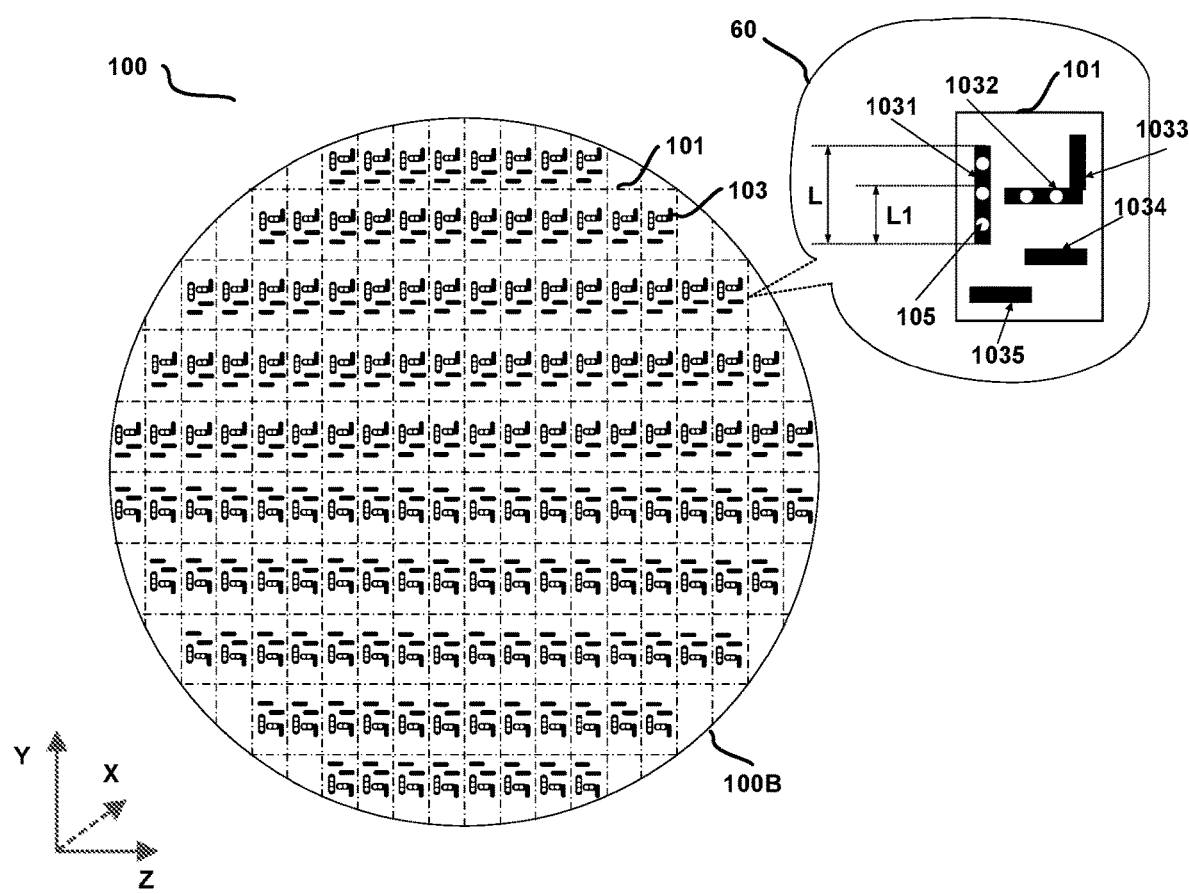
FIG. 1G illustrates an illustrative top plan view of a second surface 100B of the wafer 100 in accordance with yet another alternative embodiment of the present invention.

FIG. 1G illustrates an illustrative top plan view of the second surface (which may be referred to as the back surface) 100B of the wafer 100 projected on/inspected from/taken from the X-Y plane according to yet another variant embodiment of the present disclosure. At the same time, it can also be understood as that an illustrative top plan view of the second surface (back surface) of the integrated circuit units 101 on the X-Y plane in this further variant embodiment is shown out, and the boundaries between the integrated circuit units 101 are still indicated by dashed lines. Referring to FIG. 1G, according to an embodiment of the present disclosure, compared with the embodiments described above with reference to FIGS. 1B-1D, the difference is that t among the plurality of backside metal trace segments on the second surface 100B of the wafer 100, those having a dimension L that is greater than or equal to a first predetermined dimension L1 (for example, L1=400 μm in one example, and in another example L1=500 μm) may be referred to as large dimension metal trace segments, and one or more holes 105 may be formed in each one of the large dimension metal trace segments. For a single backside metal trace segment, dimension here refers to the relatively larger dimension of its length and width. These holes 105 may help to improve the adhesion of the backside metal layer on the second surface 100B of the wafer 100 and reduce the probability of peeling between the backside metal layer and the second surface 100B of the wafer 100. For the sake of simplicity, the example shown in FIG. 1G is only illustrated as a modification based on the "embodiment in which the backside metal layer pattern and the redistribution metal layer pattern are mirror images of each other" shown in FIG. 1D as an example, one or more holes 105 are formed in each one of the backside metal trace segments having a dimension L greater than or equal to the first predetermined dimension L1 on the back surface 1006. In this variant example shown in FIG. 1G, it also means that for each integrated circuit unit 101 obtained by cutting the wafer 100, each one of the backside metal trace segments having a dimension L greater than or equal to the first predetermined dimension L1 in the back metal layer 103 may have one or more holes 105 formed therein. For example, FIG. 1G illustrates an enlarged illustrative top plan view (projected on/inspected from the X-Y plane) of the second surface (e.g. back surface) of a single integrated circuit unit 101 according to this variant embodiment in dashed frame 60. Compared with the example of FIG. 1D (enlarged top plan view illustrated in dashed frame 30), the difference is that the two backside metal trace segments labelled with 1031 and 1032 among the five backside metal trace segments 1031 to 1035 on the second surface of each integrated circuit unit 101 are shown as having a dimension L greater than or equal to the first predetermined dimension L1, so each of the two backside metal trace segments 1031 and 1032 is illustrated as having a plurality of holes 105 formed therein. The routing traces of the five backside metal trace segments 1031 to 1035 constitute/present as the predetermined second wiring pattern of the back metal layer 103 of each IC unit 101 in this example. The routing traces of the plurality of backside metal trace segments on the entire second surface 100B of the wafer 100 constitute/present as the backside metal layer pattern of the wafer 100. Those skilled in the art should understand that for a single backside metal trace segment, the "routing trace" may be understood as its wiring routing track. For example, in the example of FIG. 1G, three holes 105 are illustrated to have been formed in the single backside metal trace segment 1031 with a dimension L larger than or equal to the first predetermined dimension L1 and the backside metal trace segment 1031 turns out not being a completely continuous solid line segment, but the line segment with holes represents the wiring routing track of the backside metal trace segment 1031, that is also the routing trace of the single backside metal trace segment 1031. Those skilled in the art should understand that although FIG. 1G shows the illustrative top plan view of a variant embodiment obtained by modifying the example of FIG. 1D, the above modifications and descriptions mentioned with reference to FIG. 1G may also be applicable to variant embodiments obtained by modifying the examples of FIGS. 1B to 1D.

As described above with reference to FIGS. 1E to 1G, the backside metal layer can not only reduce the stress of the redistribution metal layer on the wafer 100 to reduce the warpage of the wafer 100, but also may help to prevent the backside metal layer from peeling/falling off from the second surface 100B the wafer 100. Those skilled in the art should understand that these examples are not intended to limit the present invention. For example, based on extension of the embodiments of FIGS. 1E to 1G, in some other embodiments, layout pattern of the routing traces (when each routing trace is connected by a solid line) of the plurality of backside metal trace segments made in the backside metal layer on the second surface 100B of the wafer 100 may be identical to the redistribution metal layer pattern. In other embodiments, the pattern formed by the routing traces (when each routing trace is connected by a solid line) of the plurality of backside metal trace segments made in the backside metal layer at points/positions on the second surface 100B of the wafer 100 that are corresponding to points/positions on the first surface 100T (referring to the points/positions with the same coordinates on the X-Y plane) is identical to the redistribution metal layer pattern. It can also be understood that the projection on the X-Y plane of the pattern formed by the routing traces (when each routing trace is connected by a solid line) of the plurality of backside metal trace segments on the second surface 100B is identical to and overlapping with the projection on the X-Y plane of the redistribution metal layer pattern on the first surface 100T.

Figure 2A:
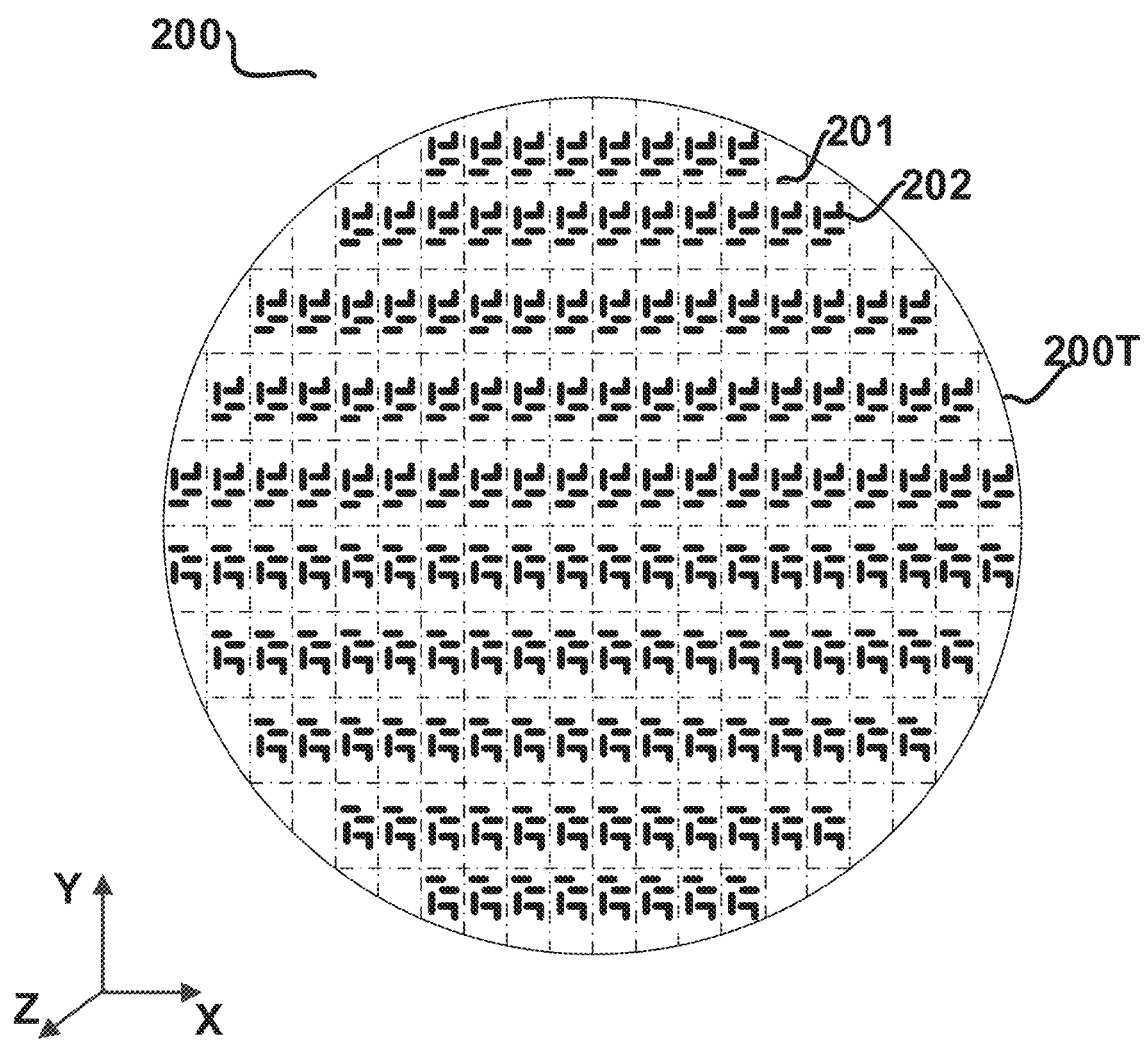
FIG. 2A illustrates an illustrative top plan view of a first surface 200T of a wafer 200 in accordance with a variant embodiment of the present invention.
Figure 2B:
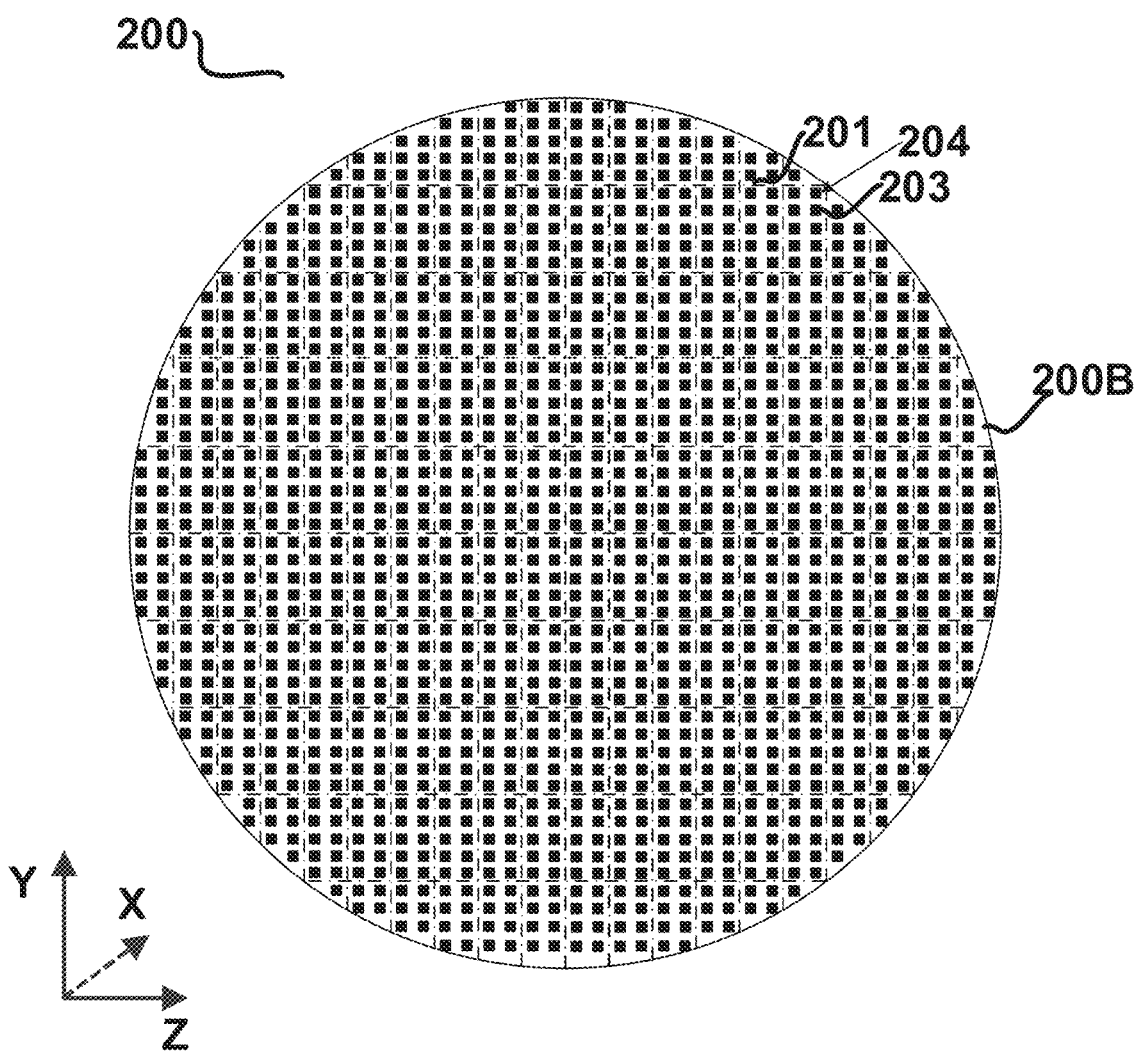
FIG. 2B illustrates an illustrative top plan view of a second surface 200B opposite to the first surface 200T of the wafer 200 in accordance with an embodiment of the present invention.

FIG. 2A illustrates a top plan view of a first surface (e.g. a front surface) 200T of a wafer 200 with integrated circuits fabricated therein in accordance with yet another variant embodiment of the present disclosure. FIG. 2B illustrates a top plan view of a second surface (e.g. a back surface) 200B opposite to the first surface (front surface) 200T of the wafer 200. These top plan views may be considered as planar views projected on/inspected from/taken from the X-Y plane in a coordinate system defined by the mutually perpendicular X-axis, Y-axis and Z-axis. A plurality of integrated circuit ("IC") units 201 may be fabricated in/on the wafer 200, and the boundaries between the IC units 201 are indicated by dashed lines. Those skilled in the art should understand that the wafer 200 may be cut into individual IC units 201 along the dashed line boundaries in the Z axis direction in subsequent processes. The present application does not limit the size of the wafer 200. Those skilled in the art should understand that most of the detailed structures of each IC unit 201 are not shown in the top plan view of FIG. 2A. A redistribution metal layer may be formed on the first surface 200T of the wafer 200, and the redistribution metal layer may be patterned to have a redistribution metal layer pattern, thereby for each IC unit 201, forming a rewiring metal layer 202 of each IC unit 201. That is to say, after patterning, the redistribution metal layer on the first surface 200T may be patterned into a plurality of redistribution metal trace segments forming a layout pattern referred to as the redistribution metal layer pattern. In the example of FIG. 2A, each one of the plurality of redistribution metal trace segments is illustrated/represented by a straight solid line segment. The rewiring metal layer 202 of each IC unit 201 may comprise a portion (e.g. multiple segments) of the plurality of redistribution metal trace segments so as to allow electrical coupling between components within each IC unit 201 and/or to allow each IC unit 201 for electrical connection and/or signal exchange with outside circuitries. The rewiring metal layer 202 of each IC unit 201 may thus have a predetermined first wiring pattern (i.e., layout pattern formed by the portion (i.e. the multiple segments) of the plurality of redistribution metal trace segments included in the rewiring metal layer 202 of each IC unit 201). Therefore, it would be understood that on the first surface (front surface) of each IC unit 201 obtained by dicing the wafer 200 such a rewiring metal layer 202 having the predetermined first wiring pattern is formed. Those skilled in the art should understand that the predetermined first wiring pattern of the rewiring metal layer 202 on the first surface 200T shown in FIG. 2A is only illustrative, and is not used to represent an actual and specific wiring pattern, nor is it used to limit or define the predetermined first wiring pattern. The predetermined first wiring pattern may be patterned according to actual circuit application requirements of each integrated circuit unit 201. The redistribution metal layer pattern on the first surface 200T of the wafer 200 is constituted by a collection of the predetermined first wiring patterns of the rewiring metal layers 202 of all the integrated circuit units 201 fabricated on/in the wafer 200.

A backside metal layer may be formed on the second surface 200B (e.g. a back surface) of the wafer 200. As illustrated in the top plan view shown in FIG. 2B, the backside metal layer may be patterned to have a backside metal layer pattern. The backside metal layer with the backside metal layer pattern may be adapted to generate a backside stress on the wafer 200 (i.e. the backside metal layer may apply the backside stress to the second surface 200B of the wafer 200) to at least partially offset a front side stress generated by the redistribution metal layer on the wafer 200 (i.e. the front side stress is applied to the first surface 200T of the wafer 200 by the redistribution metal layer). In this fashion, stress on the wafer 200 caused by the redistribution metal layer may be at least reduced. In the example of FIG. 2B, the backside metal layer is patterned into a plurality of metal blocks 204 distributed across the second surface 200B with each metal block 204 having a predetermined shape and a predetermined dimension. In accordance with an exemplary embodiment, the predetermined dimension may be smaller than or equal to 200 μm*200 μm. In another exemplary embodiment, the predetermined dimension may be smaller than or equal to 150 μm*150 μm. Although each metal block 204 in the example of FIG. 2B is shown to be of the same shape and size, those of ordinary skill in the art should understand that each metal block 204 may have a different shape and/or size than other metal blocks 204. There is a distance between every two adjacent metal blocks 204. Correspondingly, it also means that for each integrated circuit unit 201 produced by cutting the wafer 200, a back metal layer 203 on its second surface (back surface) is patterned into metal blocks 204 distributed on its second surface. In the example in FIG. 2B, the predetermined shape described is illustrated as a square, one of ordinary skill in the art should understand that this is not intended to limit the invention, in other embodiments, the predetermined shape may be any other geometric shape appropriate and compatible to the manufacturing process, such as rectangle, circle, other polygon, and so on.

In accordance with an embodiment of the present disclosure, the metal blocks 204 with each one of them of the predetermined shape are evenly distributed across the second surface 200B. Correspondingly, it also means that for each integrated circuit unit 201 produced by cutting the wafer 200, the back metal layer 203 on the second surface of the IC unit 201 is patterned into metal blocks 204 evenly distributed on the second surface of the IC unit 201 with each metal block 204 having the predetermined shape.

In accordance with an embodiment of the present disclosure, the backside metal layer formed on the second surface of the wafer (e.g. the wafer 100 or wafer 200 mentioned in the above embodiments) may have a thickness in a range of 7 μM to 20 μM. Consequently, the back metal layer 103 on the second surface of each integrated circuit unit 101 or the back metal layer 203 on the second surface of each integrated circuit unit 201 may also have the thickness in the range of 7 μM to 20 μM. In one example, the thickness of the backside metal layer of the wafer (or the thickness of the back metal layer of each IC unit produced by dicing the wafer) may be of 15 μM. In one example, the backside metal layer of the wafer (or the back metal layer of each IC unit produced by dicing the wafer) may comprise a first metal layer attached to the second surface 1006 of the wafer 100 (or attached to the second surface 200B of the wafer 200), for example, usually formed by electroplating metal. To provide an example of forming the first metal layer by electroplating copper, the first metal layer may comprise a titanium seed layer and an electroplated copper layer on the titanium seed layer. the backside metal layer of the wafer (or the back metal layer of each IC unit produced by dicing the wafer) may further comprise a second metal layer fabricated on the first metal layer. The second metal layer may for instance be formed by electroless depositing metal (e.g. one or any combination of the metals such as Ni, Pd, Au). The second metal layer may be thinner than the first metal layer. In one example, the first metal layer may have a thickness ranging from 6 μm to 15 μm, and the second metal layer may have a thickness in a range from 1 μm to 4 μm. Thickness is measured along the Z-axis dimension.

From the foregoing, it will be appreciated that specific embodiments of the present invention have been described herein for purposes of illustration, but that various modifications may be made without deviating from the invention. Many of the elements of one embodiment may be combined with other embodiments in addition to or in lieu of the elements of the other embodiments. Accordingly, the present invention is not limited except as by the appended claims.

What is claimed is:

1. A wafer, comprising:
a first surface, having a redistribution metal layer formed on the first surface, wherein the redistribution metal layer has a redistribution metal layer pattern; and
a second surface, opposite to the first surface and having a backside metal layer formed on the second surface, wherein the backside metal layer is patterned to have a backside metal layer pattern and is adapted to generate a backside stress on the wafer to at least partially offset a front side stress generated by the redistribution metal layer on the wafer.

2. The wafer of claim 1, wherein the redistribution metal layer is patterned into a plurality of redistribution metal trace segments having a layout pattern forming the redistribution metal layer pattern.

3. The wafer of claim 1, wherein the backside metal layer is patterned into a plurality of backside metal trace segments, and wherein routing traces of the plurality of backside metal trace segments forming the backside metal layer pattern.

4. The wafer of claim 3, wherein the backside metal layer pattern is identical to the redistribution metal layer pattern.

5. The wafer of claim 3, wherein the backside metal layer pattern and the redistribution metal layer pattern are mirror images of each other with reference to a middle plane between the first surface and the second surface of the wafer.

6. The wafer of claim 3, wherein among the plurality of backside metal trace segments, each one of those having a dimension that is greater than or equal to a first predetermined dimension is either further divided into metal blocks with each metal block of a dimension smaller than or equal to a second predetermined dimension that is smaller than the first predetermined dimension or has one or more holes formed therein.

7. The wafer of claim 6, wherein the first predetermined dimension is of 400 μm to 500 μm, and wherein the second predetermined dimension is of 150 μm to 200 μm.

8. The wafer of claim 3, wherein each one of the plurality of backside metal trace segments is further divided into metal blocks with each metal block of a dimension smaller than or equal to a second predetermined dimension.

9. The wafer of claim 8, wherein the second predetermined dimension is of 150 μm to 200 μm.

10. The wafer of claim 1, wherein backside metal layer has a thickness in a range of 7 μM to 20 μM.

11. The wafer of claim 1, wherein the backside metal layer comprises a first metal layer attached to the second surface of the wafer and a second metal layer formed on the first metal layer, and wherein the second metal layer is thinner than the first metal layer.

12. The wafer of claim 1, wherein the backside metal layer is patterned into a plurality of metal blocks distributed across the second surface of the wafer with each metal block having a predetermined shape.

13. The wafer of claim 12, wherein the plurality of metal blocks are evenly distributed across the entire second surface of the wafer.

14. The wafer of claim 12, wherein each one of the plurality of metal blocks has a predetermined dimension smaller than or equal to 200 μm×200 μm.

15. The wafer of claim 1, further comprising a plurality of integrated circuit ("IC") units formed in/on the wafer, wherein the redistribution metal layer is patterned to form a rewiring metal layer for each one IC unit of the plurality of IC units, and wherein the rewiring metal layer for each one IC unit has a predetermined first wiring pattern.

16. The wafer of claim 15, wherein the redistribution metal layer pattern on the first surface of the wafer is constituted by a collection of the predetermined first wiring patterns of the rewiring metal layers of all the plurality of IC units fabricated on/in the wafer.

17. The wafer of claim 15, wherein the backside metal layer is patterned to form a back metal layer for each one IC unit of the plurality of IC units, and wherein the back metal layer for each one IC unit has a predetermined second wiring pattern.

18. The wafer of claim 17, wherein the backside metal layer pattern on the second surface of the wafer is an aggregate pattern of the predetermined second wiring patterns of the back metal layers of all the plurality of IC units presented on the second surface of the wafer.

19. An integrated circuit ("IC") unit, comprising:
a die, having a front surface and a back surface opposite to the front surface, wherein a rewiring metal layer is formed on the front surface and is patterned to have a predetermined first wiring pattern, and wherein a back metal layer is formed on the back surface and is patterned to have a predetermined second wiring pattern and is adapted to generate a backside stress on the die to at least partially offset a front side stress generated by the rewiring metal layer on the die.

20. The IC unit of claim 19, wherein the rewiring metal layer comprises multiple redistribution metal trace segments having a layout pattern forming the predetermined first wiring pattern.

21. The IC unit of claim 19, wherein the back metal layer is patterned into multiple backside metal trace segments, and wherein layout pattern of routing traces of the multiple backside metal trace segments forms the predetermined second wiring pattern.

22. The IC unit of claim 21, wherein the predetermined second wiring pattern is identical to the predetermined first wiring pattern.

23. The IC unit of claim 21, wherein the predetermined second wiring pattern and the predetermined first wiring pattern are mirror images of each other with reference to a middle plane between the front surface and the back surface of the die.

24. The IC unit of claim 21, wherein among the multiple backside metal trace segments, each one of those having a dimension that is greater than or equal to a first predetermined dimension is either further divided into metal blocks with each metal block of a dimension smaller than or equal to a second predetermined dimension that is smaller than the first predetermined dimension or has one or more holes formed therein.

25. The IC unit of claim 24, wherein the first predetermined dimension is of 400 μm to 500 μm, and wherein the second predetermined dimension is of 150 μm to 200 μm.

26. The IC unit of claim 21, wherein each one of the multiple backside metal trace segments is further divided into metal blocks with each metal block of a dimension smaller than or equal to a second predetermined dimension.

27. The IC unit of claim 26, wherein the second predetermined dimension is of 150 μm to 200 μm.

28. The IC unit of claim 26, wherein the back metal layer has a thickness in a range of 7 μM to 20 μM.

29. The IC unit of claim 19, wherein the back metal layer is patterned into a plurality of metal blocks distributed across the back surface of the die with each metal block having a predetermined shape.

30. The IC unit of claim 29, wherein the plurality of metal blocks are evenly distributed across the entire back surface of the die.

31. The IC unit of claim 29, wherein each one of the plurality of metal blocks has a predetermined dimension smaller than or equal to 200 μm×200 μm.

* * * * *